(12) United States Patent
Soman et al.

(10) Patent No.: US 11,522,078 B2
(45) Date of Patent: Dec. 6, 2022

(54) HIGH ELECTRON MOBILITY TRANSISTOR (HEMT) WITH RESURF JUNCTION

(71) Applicant: Indian Institute of Science, Karnataka Bangalore (IN)

(72) Inventors: Rohith Soman, Karnataka Bangalore (IN); Ankit Soni, Karnataka Bangalore (IN); Mayank Shrivastava, Karnataka Bangalore (IN); Srinivasan Raghavan, Karnataka Bangalore (IN); Navakant Bhat, Karnataka Bangalore (IN)

(73) Assignee: INDIAN INSTITUTE OF SCIENCE, Karnataka Bangalore (IN)

( * ) Notice: Subject to any disclaimer, the term of this patent is extended or adjusted under 35 U.S.C. 154(b) by 173 days.

(21) Appl. No.: 16/629,156

(22) PCT Filed: Jul. 6, 2018

(86) PCT No.: PCT/IN2018/050438
§ 371 (c)(1),
(2) Date: Jan. 7, 2020

(87) PCT Pub. No.: WO2019/008603
PCT Pub. Date: Jan. 10, 2019

(65) Prior Publication Data
US 2020/0227543 A1    Jul. 16, 2020

(30) Foreign Application Priority Data
Jul. 7, 2017   (IN) .............................. 201741024073

(51) Int. Cl.
*H01L 29/778*   (2006.01)
*H01L 29/06*    (2006.01)
(Continued)

(52) U.S. Cl.
CPC ........ *H01L 29/7786* (2013.01); *H01L 29/063* (2013.01); *H01L 29/2003* (2013.01);
(Continued)

(58) Field of Classification Search
None
See application file for complete search history.

(56) References Cited

U.S. PATENT DOCUMENTS 6,100,549 A  *  8/2000  Weitzel ................. H01L 29/802
                                                      257/194
7,449,762 B1 * 11/2008  Singh ................ H01L 29/66522
                                                      257/493
(Continued)

FOREIGN PATENT DOCUMENTS

CN    103178107 B    4/2016
CN    106920844 A    7/2017

OTHER PUBLICATIONS

Arulkumaran, S. "Studies on the Influences of i-GaN, n-GaN, p-GaN and InGaN Cap Layers in AlGaN/GaN High-Electron-Mobility Transistors" J. J. of App. Phys. 44 No. 5a May 10, 2005 pp. 2953-2960 (Year: 2005).*
(Continued)

*Primary Examiner* — Grant S Withers
(74) *Attorney, Agent, or Firm* — Panitch Schwarze Belisario & Nadel LLP

(57) ABSTRACT

A High Electron Mobility Transistor (HEMT) having a reduced surface field (RESURF) junction is provided. The HEMT includes a source electrode at a first end and a drain electrode at a second end. A gate electrode is provided between the source electrode and the drain electrode. A reduced surface field (RESURF) junction extends from the first end to the second end. The gate electrode is provided above the RESURF junction. A buried channel layer is formed in the RESURF junction on application of a positive
(Continued)

voltage at the gate electrode. The RESURF junction includes an n-type Gallium nitride (GaN) layer and a p-type GaN layer. The n-type GaN layer is provided between the p-type GaN layer and the gate electrode.

15 Claims, 13 Drawing Sheets

(51) Int. Cl.
  *H01L 29/20* (2006.01)
  *H01L 29/205* (2006.01)
  *H01L 29/40* (2006.01)
  *H01L 29/423* (2006.01)

(52) U.S. Cl.
  CPC .......... *H01L 29/205* (2013.01); *H01L 29/404* (2013.01); *H01L 29/42316* (2013.01); *H01L 29/7787* (2013.01)

(56) References Cited

U.S. PATENT DOCUMENTS

| | | | | |
|---|---|---|---|---|
| 8,759,879 | B1* | 6/2014 | Tipirneni | H01L 29/063 |
| | | | | 257/194 |
| 2009/0206371 | A1* | 8/2009 | Oka | H01L 29/4236 |
| | | | | 257/201 |
| 2010/0032716 | A1* | 2/2010 | Sato | H01L 29/66462 |
| | | | | 257/192 |
| 2011/0227093 | A1* | 9/2011 | Hikita | H01L 29/41766 |
| | | | | 257/76 |
| 2017/0077277 | A1* | 3/2017 | Saito | H01L 29/7786 |
| 2017/0345919 | A1* | 11/2017 | Oyama | H01L 29/0657 |

OTHER PUBLICATIONS

Yang, S. "Enhancement-Mode LaLuO3—AlGaN/GaN Metal-Insulator-Semiconductor High-Electron-Mobility Transistors using Fluorine Plasma Ion Implantation" Jap. J. of App. Phys. 52 May 20, 2013 (Year: 2013).*

Int'l Search Report and Written Opinion dated Sep. 19, 2018 in Int'l Application No. PCT/IN2018/050438.

* cited by examiner

HIGH ELECTRON MOBILITY TRANSISTOR (HEMT) WITH RESURF JUNCTION

CROSS-REFERENCE TO RELATED APPLICATION

This application is a Section 371 of International Application No. PCT/IN2018/050438, filed Jul. 6, 2018, which was published in the English language on Jan. 10, 2019, under International Publication No. WO2019/008603, which claims priority under 35 U.S.C. § 119(b) to Indian Application No. 201741024073, filed Jul. 7, 2017, the disclosures of all of which are incorporated herein by reference in their entirety.

TECHNICAL FIELD

The present subject matter relates in general to High Electron Mobility Transistors (HEMTs), and in particular to Gallium nitride HEMTs.

BACKGROUND

Power electronic products have a wide range of applications, for example, in automotive industry, power distribution, motor control, converters, inverters, and the like. Generally, power electronic applications involve use of high voltage and high current transistor in converter switching functions. Typically, they are also associated with inherent conducting and switching losses. These losses range from 6 to 8% in a power conversion equipment. Reducing these losses while increasing frequency of switching has been one of the central research objectives of semiconductor technology.

High Electron Mobility Transistor (HEMT) fabricated with heterojunction of Aluminum gallium nitride/Gallium nitride (AlGaN/GaN) have been used for power electronics applications. However, AlGaN/GaN HEMTs are normally-ON transistors. This means that upon powering on the device, a conducting 2DEG (Two-dimensional Electron Gas) pathway exists between a source terminal and a drain terminal of the HEMT. Therefore, a negative bias needs to be applied to the gate electrode to deplete the channel.

A normally-OFF operation is desired in power electronics applications for safe operation and simple gate drive circuits. Multiple techniques to fabricate normally-OFF AlGaN/GaN HEMTs, such as gate recess etching, introducing p-GaN gate or p-AlGaN below a gate electrode, fluorine ion implantation below the gate electrode, using cascode configuration of silicon metal oxide semiconductor (Si MOS) with a normally-ON HEMT device, are known. Among these, gate recess etching and introducing p-GaN or p-AlGaN gate structure provide better performance than the other techniques known in art.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

The present subject matter provides a buried channel normally-OFF Gallium Nitride High Electron Mobility Transistor (GaN HEMT) with a RESURF (Reduced Surface Field) Junction.

Generally, research in semiconductor electronics has been focused on reducing power losses and increasing frequency of switching in power electronics application. HEMTs comprising Aluminium gallium nitride/Gallium nitride (AlGaN/GaN) heterojunction have been used for power electronic applications because of their wide band gap and formation of Two-dimensional Electron Gas (2DEG) at the heterojunction. Further, AlGaN/GaN HEMTs are a normally-ON transistor. This means that upon powering on, a conducting 2DEG pathway exists between a source terminal and a drain terminal of the AlGaN/GaN HEMT. On application of a negative bias at a gate electrode of the AlGaN/GaN HEMT a channel layer is depleted.

However, while AlGaN/GaN HEMTs are used in power electronics, a normally-OFF operation is desired in power electronics applications for safe operation.

Figure 1:
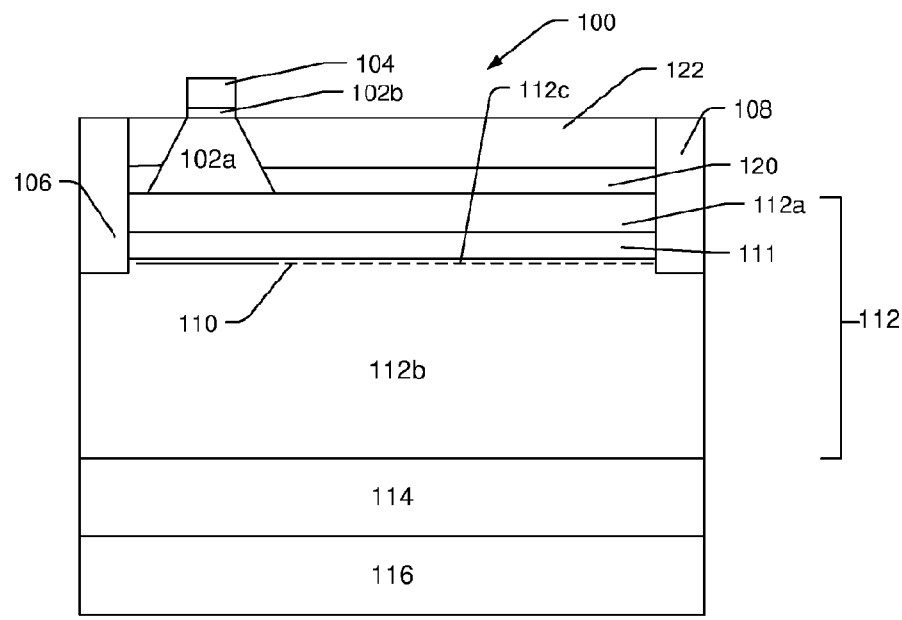
FIG. 1 illustrates a GaN High Electron Mobility Transistor (HEMT) known in prior art.

A first technique, as shown in FIG. 1, for fabricating a normally-OFF HEMT 100 includes providing a p-GaN reverse polarization layer 102a and a gate dielectric 102b under a gate electrode 104. The HEMT 100 also comprises a source electrode 106 and a drain electrode 108. The HEMT 100 comprises an AlGaN/GaN heterojunction 112.

AlGaN/GaN heterojunction, formed by an AlGaN layer 112a and GaN layer 112b, has an inbuilt polarization which is a function of dipole moment. On application of stress in HEMT 100, for example, during epitaxial growth, the dipole moment varies. Typically, the AlGaN layer 112a depicts higher polarization during stress than GaN layer 112b as thickness of the AlGaN layer 112a is lesser than that of GaN layer 112b. Due to difference in bandgap between AlGaN layer 112a and GaN layer 112b, a Two-Dimensional Electron Gas (2DEG) 112c is formed between the AlGaN layer 112a and GaN layer 112b substantially close to the drain electrode 108. In an example, the AlGaN/GaN heterojunction can comprise an AlN layer 111 provided between the AlGaN layer 112a and the GaN layer 112b to enhance 2DEG mobility.

In the HEMT 100, when gate-to-source voltage is below threshold, i.e., when a negative voltage or 0 V is applied at the gate electrode 104, due to presence of the p-GaN reverse polarization layer 102a, channel layer 110 is depleted of electrons and the HEMT 100 remains off. When the gate-to-source voltage exceeds threshold voltage, i.e., when a positive voltage is applied at the gate electrode 104, the channel layer 110 accumulates electrons, thereby turning the HEMT 100 ON.

This technique, therefore, requires the p-GaN reverse polarization layer 102a to be provided over the AlGaN/GaN heterojunction. As will be understood, the AlGaN/GaN heterojunction maybe provided over other layers, such as a nucleation layer 114 and a substrate 116. Further, the AlGaN/GaN heterojunction can also have other layers, such as GaN cap 120 and a passivation dielectric layer 122 provided thereon. Typically, the gate electrode 104 is 50-100 nm away from the AlGaN/GaN heterojunction. Therefore, extent of control of the channel layer 110 by the gate electrode 104 is substantially reduced. Therefore, the HEMT as shown in FIG. 1 has a slower turn-on and larger gate voltage swing for switching operation. This adds to dynamic or turn-on losses.

Figure 2:
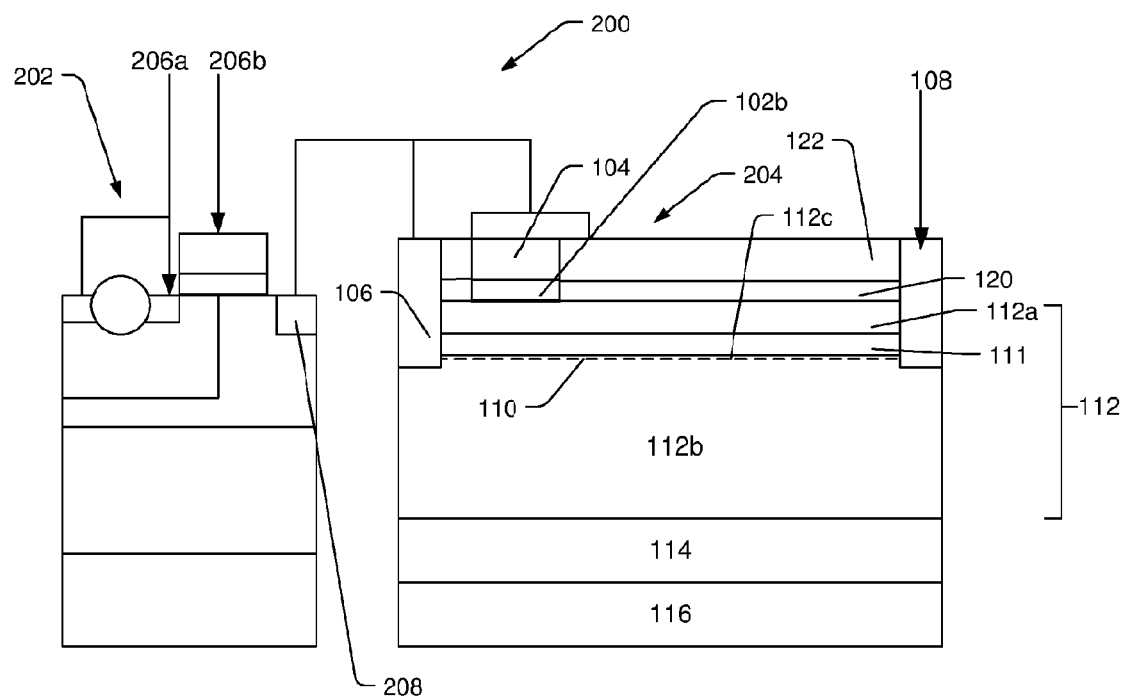
FIG. 2 illustrates yet another GaN HEMT known in prior art integrating an LDMOS (Laterally diffuse MOSFET) and an HEMT in the same die of the HEMT device.

FIG. 2 illustrates another architecture of a normally-OFF GaN device 200. FIG. 2 depicts a cascode configuration structure where two devices, namely Laterally Diffused MOSFET (LDMOS) 202 and a GaN HEMT 204 are co-located on a die and interconnected. In FIG. 2, the HEMT 204 device is to increase breakdown voltage. The LDMOS 202 is for providing the normally-OFF operation. FIG. 2 further illustrates the interconnection of the LDMOS 202 and the HEMT 204. An LDMOS source electrode 206a and an LDMOS gate electrode 206b function as source and gate of the GaN device 200. Drain electrode 108 of the HEMT 204 works as drain of the GaN device 200. Gate electrode 104, source electrode 106 of HEMT 204, and drain electrode 208 of LDMOS 202 are tied together and are, therefore, not available for electrical contact. In operation, the HEMT 204 blocks higher voltages, thereby, increase breakdown voltage, and the LDMOS 202 is for normally-OFF operation.

The GaN device 200 as shown in FIG. 2 provides normally-OFF operation. However, it requires devices from two technologies, namely LDMOS 202 and HEMT 204. Therefore, performance efficiency of the GaN device 200 is low and is limited to channel characteristics of the LDMOS 202 when compared to the HEMT 100 of FIG. 1. Further, the GaN device 200 is known to be less reliable both under extended stress as well as under short circuit stress condition.

Figure 3:
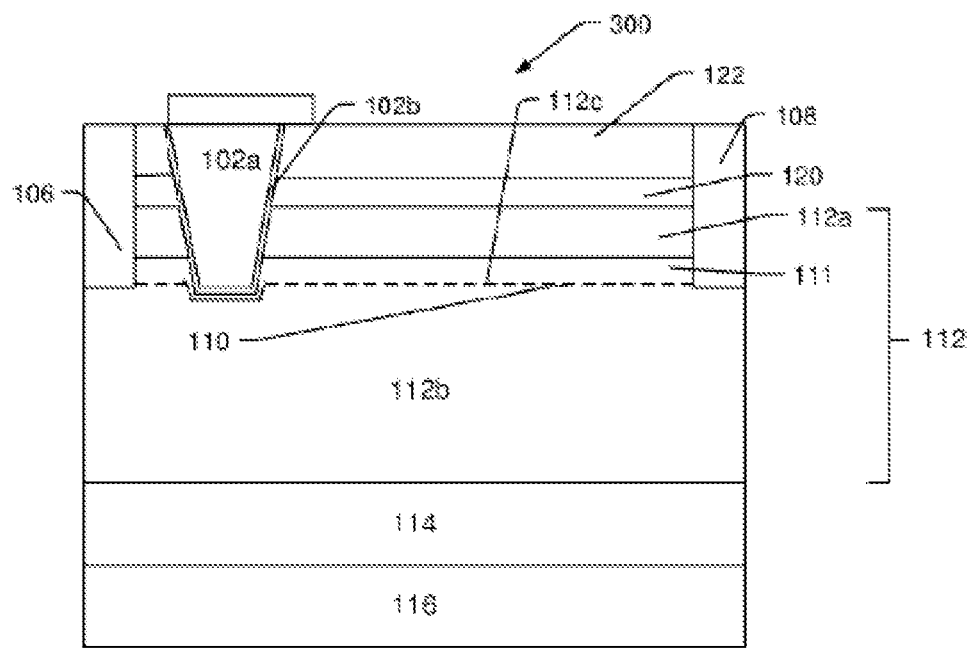
FIG. 3 illustrates yet another GaN HEMT known in prior art with a recessed gate structure.

FIG. 3 illustrates another GaN device 300 which is a normally-OFF device. The GaN device 300 is a lateral epitaxial GaN Metal Insulator Semiconductor Field Effect Transistor (MISFET) having a recessed gate which is in direct contact with a p-GaN layer 112b. The recessed gate comprises the gate electrode 102a and the gate dielectric 102b. As the recessed gate is in direct contact with p-GaN layer 112b, channel formation in GaN device 300 is slow. Moreover, due to unavailability of minority carriers (electrons) in the p-GaN layer 112b, electron density of the channel formed is very small. This further causes higher ON resistance and, thereby, large conduction losses.

Further, as the AlGaN layer 112a is above the p-GaN layer 112b, carrier density in channel is expected to be very less. This further leads to ON resistance. High breakdown voltage would require higher doping of the p-GaN layer 112b, however this can deplete 2DEG. In addition, as the AlGaN layer 112a has a substantially less thickness compared to p-GaN layer 112b (typical AlGaN is 25-40 nm thick), the GaN device 300 offers significantly low breakdown voltage when compared to device without p-GaN layer 112b, i.e., comprising an n-doped GaN layer. Considering this, the GaN device 300 provides inferior breakdown voltage when compared to other prior art devices as shown in FIG. 1 and FIG. 2.

Further, for fabrication of the recessed gate 102a as shown in FIG. 3, a gate recess etching may be used whereby the gate dielectric 102b is inserted between the gate electrode 102a and the AlGaN layer 112a. This is done to scale up threshold voltage as a high gate voltage swing is preferred in power electronics applications. Gate recess etching or gate recess technique relies on the fact that a minimum thickness is required for the surface states of the AlGaN layer 112a to donate electrons to the 2DEG formed at the AlGaN/GaN heterojunction. Therefore, AlGaN layer 112a below the gate electrode 102a is etched partially or completely to deplete the 2DEG below the gate electrode 102a. This fabrication step is done using chlorine plasma in a Reactive Ion Etching (RIE) chamber as known in art.

The challenge posed by this technique is to get a smooth and damage free interface between the gate dielectric and etched GaN. The smooth and damage free interface ensures electron transport below gate recessed region with less scattering at the interface roughness. Therefore, gate recess etching technique is focused on optimizing an etching recipe which provides a smooth and damage free etch-surface to reduce electron scattering. Slow etch rate recipes or digital etching schemes are being followed for getting a low etch-damaged semiconductor surface.

Even with these advanced etching techniques, scattering of electrons at the etch damages are not completely eliminated. Further, another challenge in AlGaN/GaN HEMTs is buffer leakage. This limits the breakdown voltage of the transistor. Nitrogen vacancies and incorporation of oxygen in GaN, which act as an n-type dopant, are the main sources of buffer leakage current. This problem is generally solved by counter doping GaN with C (Carbon), Fe (Iron) or Mg (Magnesium).

The subject matter discussed here addresses both these issues by having a p-n junction in the GaN buffer stack. By adjusting the doping levels and the thickness of the p-type and n-type layer, a better ON state characteristics and OFF-state characteristics can be achieved.

The present subject matter provides a High Electron Mobility Transistor (HEMT) comprising a reduced surface field (RESURF) junction. The HEMT comprises a source electrode at a first end and a drain electrode at a second end. A gate electrode is provided between the source electrode and the drain electrode. A reduced surface field (RESURF) junction extends from the first end to the second end. The gate electrode is provided above the RESURF junction. A three-dimensional (3-D) buried channel of electrons is formed in the RESURF junction on application of a positive voltage at the gate electrode. The RESURF junction comprises an n-type Gallium nitride (GaN) layer and a p-type GaN layer. The n-type GaN layer is provided between the p-type GaN layer and the gate electrode.

In an example, the RESURF junction may comprise an unintentionally doped (UID)-GaN layer provided on the n-type GaN layer. A channel layer may be formed on the n-type GaN layer which substantially comprises of 2DEG. The channel layer can comprise an etched portion substantially close to the source electrode and the gate electrode can be provided substantially above the etched portion. A plurality of layers may be provided on the channel layer.

The plurality of layers may comprise an Aluminum nitride (AlN) layer provided on the channel layer. An Aluminium gallium nitride (AlGaN) layer may be provided on the AlN layer. A GaN cap may be provided on the AlGaN layer. A passivation dielectric layer may be provided on the GaN cap. The gate electrode may extend substantially from the passivation dielectric layer into the n-type GaN or the UID-GaN layer. The gate electrode may be coated with a gate oxide.

An Inter-Layer Dielectric (ILD) may be provided on the passivation dielectric layer. A first field plate (FP) may be provided in the ILD above the gate electrode. A second FP may be provided on the ILD above the gate electrode. In an example, the second FP extends over the source electrode at the first end.

In an example, the p-type GaN layer may extend beyond the source electrode into an extended portion. A substrate contact may be provided on the p-type GaN layer in the extended portion. A third FP may be provided over the drain electrode at the second end. In an example, the second FP extends over the substrate contact.

In an example, the gate electrode may extend from the ILD to the GaN cap. In said example, the gate electrode may comprise a gate metal and a gate dielectric, provided on the gate dielectric. The gate metal and the gate dielectric may be provided in the ILD. The gate electrode may also comprise a p-GaN gate layer. The gate dielectric can be provided on the p-GaN layer and the p-GaN gate layer extends from the passivation dielectric layer to the GaN cap.

In an example, thickness and doping levels of the n-type Gallium nitride (GaN) layer may be tweaked so that the buried channel forms slightly below the gate electrode. A fluorine ion implantation may be provided below the gate. The HEMT of the present subject matter provides an improved ON-resistance, improved OFF-state leakage current and improved breakdown voltage. It further mitigates the short channel effects and, therefore, improves the gate control over the channel. It also increases switching speed for a given breakdown voltage and provides improved device reliability. Further, the device of the present subject matter reduces power device footprint for a given $V_{BD}$ (Voltage Breakdown)×$R_{ON}$ (ON Resistance), hence, lowering costs. It reduces gate field plate length and, thereby, reduces gate-to-drain (miller) capacitance.

The above and other features, aspects, and advantages of the subject matter will be better explained with regard to the following description and accompanying figures. It should be noted that the description and figures merely illustrate the principles of the present subject matter along with examples described herein and, should not be construed as a limitation to the present subject matter. It is thus understood that various arrangements may be devised that, although not explicitly described or shown herein, embody the principles of the present disclosure. Moreover, all statements herein reciting principles, aspects, and examples thereof, are intended to encompass equivalents thereof. Further, for the sake of simplicity, and without limitation, the same numbers are used throughout the drawings to reference like features and components.

Figure 4:
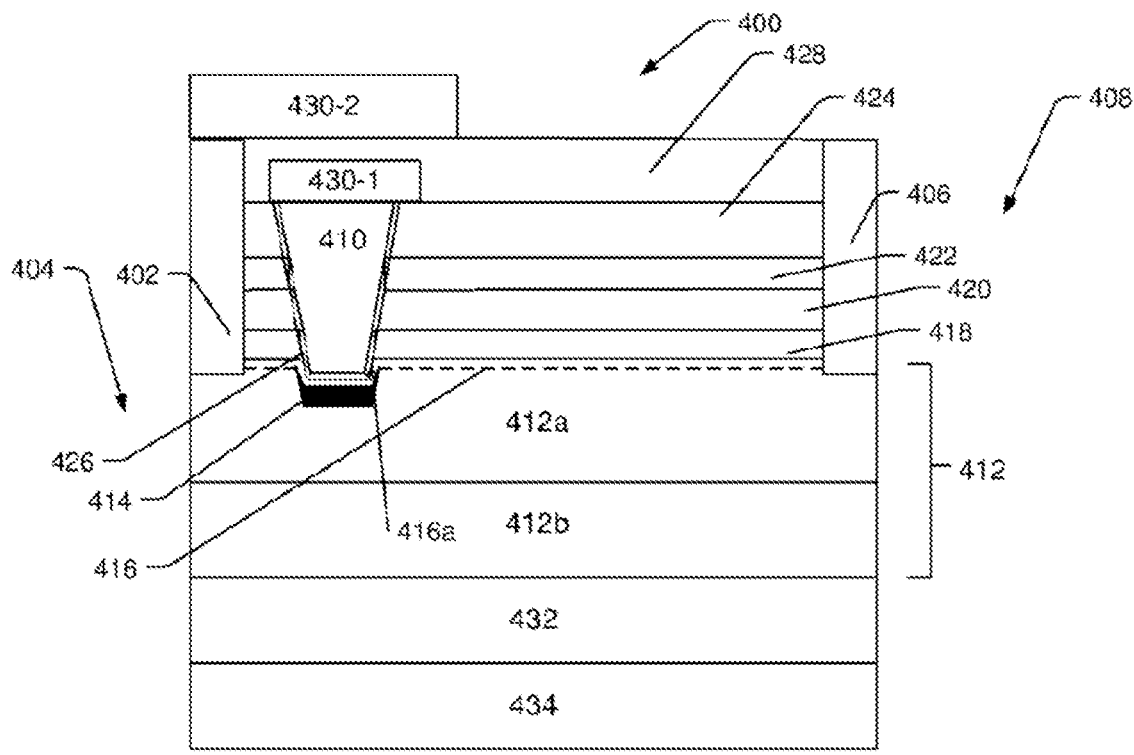
FIG. 4 illustrates a HEMT device of the present subject matter, in accordance with an implementation of the present subject matter.

FIG. 4 depicts a cross-section view of a High Electron Mobility Transistor (HEMT) 400, in accordance with an implementation of the present subject matter. The HEMT 400 comprises a source electrode 402 at a first end 404 of the HEMT 400 and a drain electrode 406 at a second end 408. In an example, the source electrode 402 and the drain electrode 406 are fabricated from metal selected from the group consisting of titanium, aluminum, nickel, gold, alloys, and the like.

A gate electrode 410 can be provided between the source electrode 402 and the drain electrode 406. A reduced surface field (RESURF) junction 412 extends from the first end 404 to the second end 408. The gate electrode 410 is provided above the RESURF junction 412. A 3-D buried channel of electrons 414 is formed in the RESURF junction 412 on application on positive voltage at the gate electrode 410. Therefore, the HEMT 400 is a normally-OFF HEMT.

The RESURF junction 412 comprising an n-type Gallium nitride (GaN) layer 412a and a p-type GaN layer 412b. The n-type GaN layer 412a is provided between the p-type GaN layer 412b and the gate electrode 410. In an example, thickness of the n-type GaN layer 412a is in a range of 75 nm to 1 µm and the thickness of the p-type GaN layer 412b is in a range of 400 nm to 3 µm.

In an example, a channel layer 416 may be formed on the n-type GaN layer 412a. The channel layer 416 substantially comprises 2DEG. The channel layer 416 comprises an etched portion 416a substantially close to the source electrode 402. The gate electrode 410 may be provided substantially above the etched portion 416a. In an example, the gate electrode 410 is a recessed gate as shown in FIG. 4. However, other configurations of the gate electrode 410 are possible as will be explained later with reference to FIGS. 5-16.

In an example, a plurality of layers may be provided over the channel layer 416. The plurality of layers may comprise an Aluminum nitride (AlN) layer 418 provided on the channel layer 416. In an example, the AlN layer 418 has a thickness in a range of 1 nm-2 nm. An Aluminium gallium nitride (AlGaN) layer 420 may be provided on the AlN layer 418. In an example, the AlGaN layer 420 has a thickness in a range of 10 nm-30 nm. A GaN cap 422 may be provided on the AlGaN layer 420. In an example, the GaN cap 422 has a thickness in a range of 2 nm-50 nm. While the plurality of layers is as described above, other configurations of the plurality of layers are possible, for example, as will be described later with reference to FIG. 12

A passivation dielectric layer 424 may be provided on the GaN cap 422. In an example, the passivation dielectric layer 424 can be fabricated from a group consisting of silicon dioxide, silicon nitrides and the like and has a thickness in a range of 10 nm-200 nm. In an example, as shown in FIG. 4, the gate electrode 410 extends substantially from the passivation dielectric layer 424 into the n-type GaN layer 412*a*. However, other configurations of the gate electrode 410 within the plurality of layers are possible as will be explained later with reference to FIG. 16. Further, as shown in FIG. 4, the gate electrode 410 can be coated with a gate oxide 426.

In an example, an Inter-Layer Dielectric (ILD) 428 may be provided on the passivation dielectric layer 424. In an example, the ILD 428 has a thickness in the range of 100 nm-1 µm. In an example, the ILD 428 is fabricated from dielectrics selected from the group consisting of silicon dioxide, silicon nitrides, and the like.

A first field plate (FP) 430-1 can be provided in the ILD 428 above the gate electrode 410. A second FP 430-2 can be provided on the ILD 428 above the gate electrode 428. The second FP 430-2 can extend over the source electrode 402 at the first end 404.

In an example, the RESURF junction 412 may be provided over other layers, for example, nucleation layer 432 and substrate 434. In said example, the nucleation layer 432 is provided over the substrate 434. The nucleation layer 432 can be a single layer or can comprise multiple layers. In an example, the nucleation layer 432 is fabricated from AlN and has a thickness in a range of 7 nm-400 nm. In an example, the substrate 434 is selected from the group consisting of silicon, silicon carbide sapphire, gallium nitride, and the like.

Figure 5:
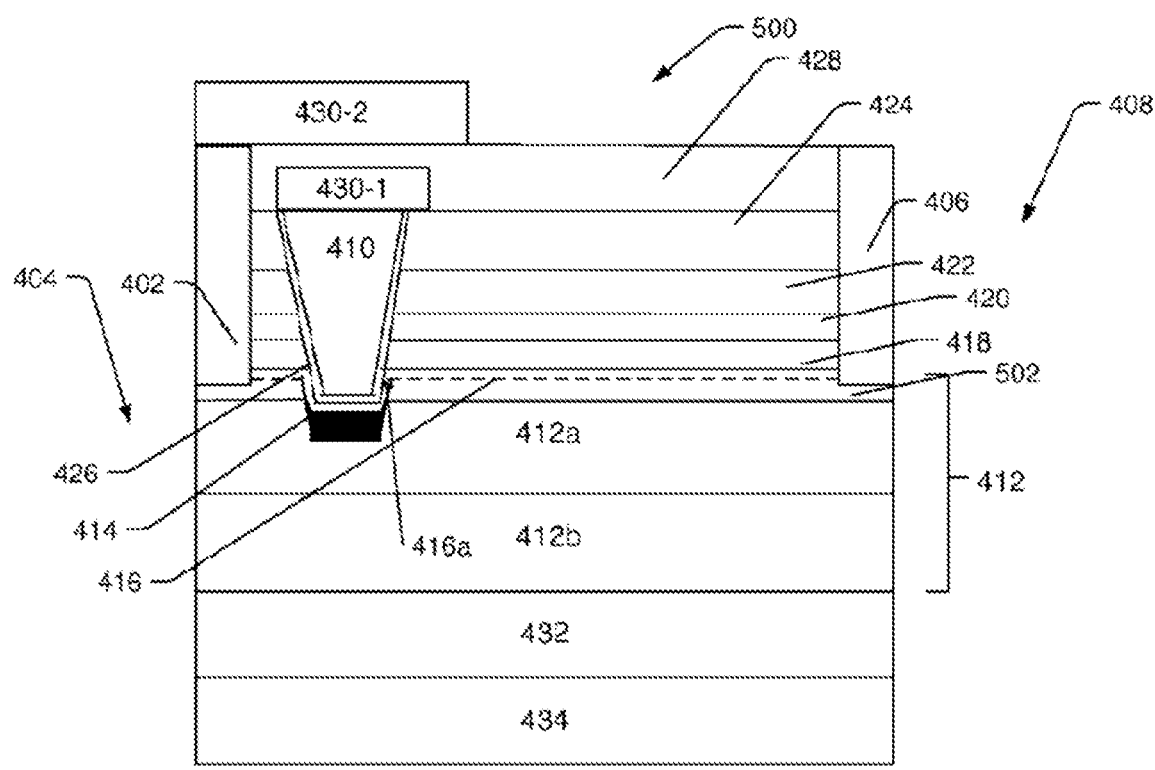
FIG. 5 illustrates yet another HEMT, in accordance with an implementation of the present subject matter.

FIG. 5 depicts yet another HEMT 500, in accordance with an example implementation of the present subject matter. In the HEMT 500 as shown in FIG. 5, in addition to the n-type GaN layer 412*a* and the p-type GaN layer 412*b*, the RESURF junction 412 comprises an unintentionally doped UID-GaN layer 502 provided on the n-type GaN layer 412*a*. In an example, the UID-GaN layer 502 has a thickness in a range of 50 nm-500 nm. In the HEMT 500 as shown in FIG. 5, the gate electrode 410 extends from the passive dielectric layer 424 through the UID-GaN layer 502 into the n-type GaN layer 412*a*.

Figure 6:
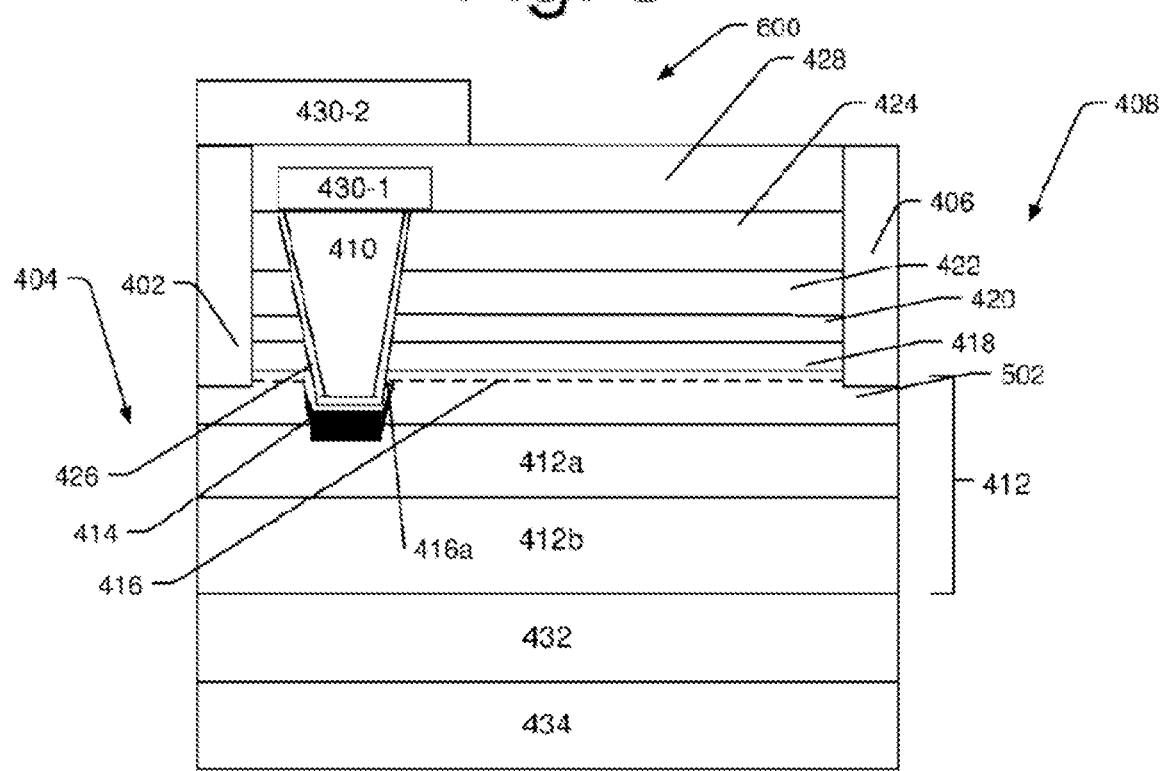
FIG. 6 illustrates yet another HEMT, in accordance with an implementation of the present subject matter.

FIG. 6 depicts yet another HEMT 600, in accordance with an example implementation of the present subject matter. In the HEMT 600 as shown in FIG. 6, the gate electrode 410 extends from the passive dielectric layer 424 into the UID-GaN layer 502.

Figure 7:
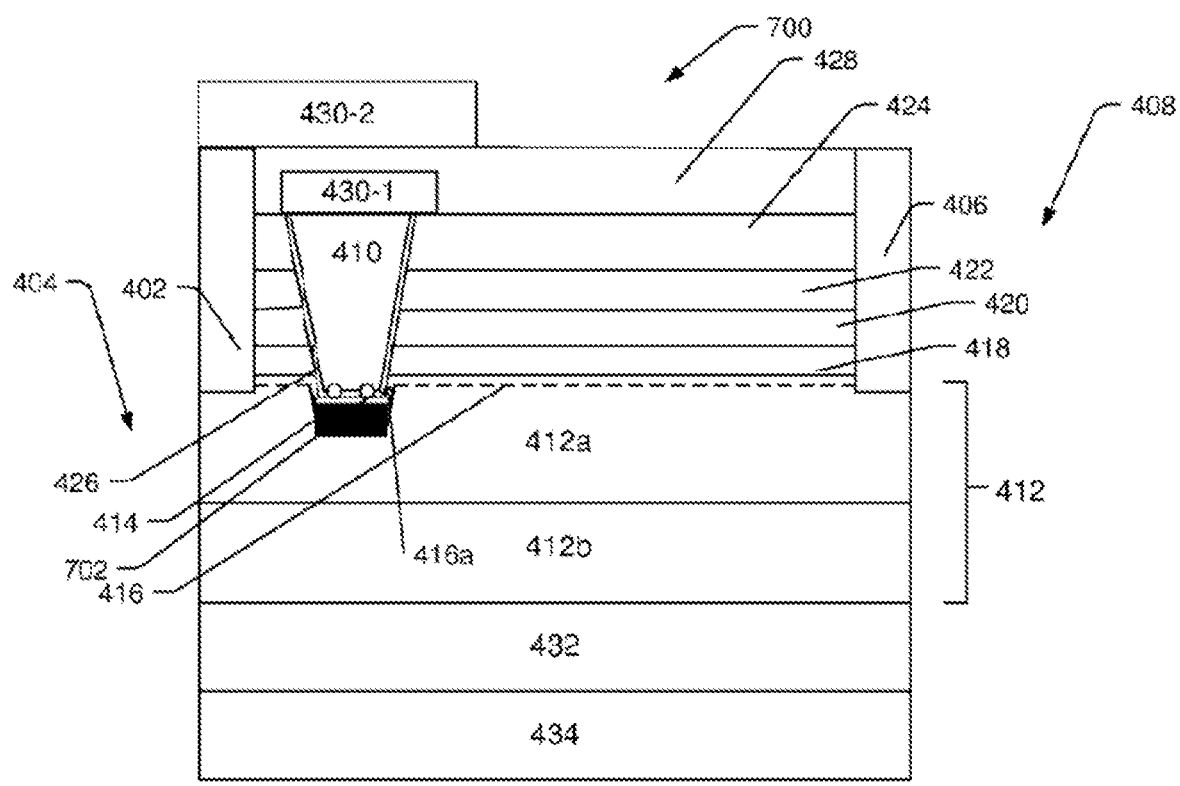
FIG. 7 illustrates yet another HEMT, in accordance with an implementation of the present subject matter.

FIG. 7 depicts yet another HEMT 700, in accordance with an example implementation of the present subject matter. In the HEMT 700 as shown in FIG. 7, the gate oxide 426 may be implanted with fluorine ions as depicted by ions 702. Further, in the HEMT 700, the UID-GaN layer is absent and the AlN layer 418 can be directly provided on the n-type GaN layer 412*a*. The gate electrode 410 extends into the n-type GaN layer 412*a*.

Figure 8:
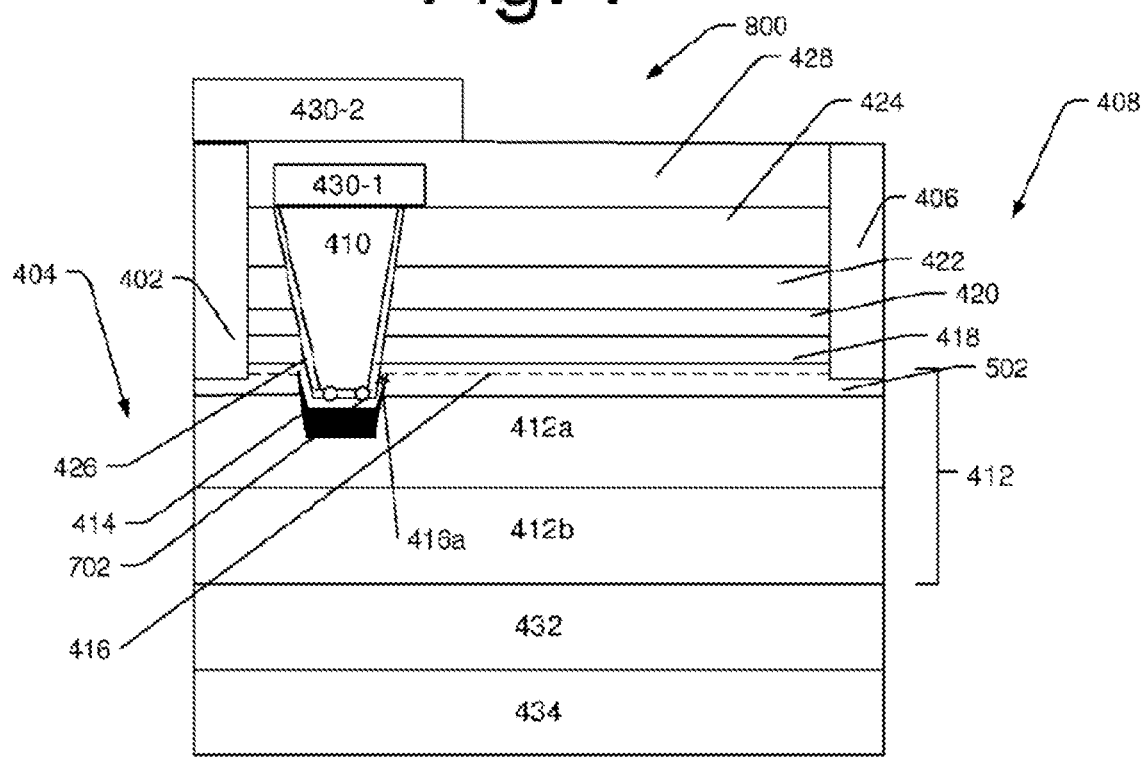
FIG. 8 illustrates yet another HEMT, in accordance with an implementation of the present subject matter.

FIG. 8 depicts yet another HEMT 800, in accordance with an implementation of the present subject matter. In the HEMT 800, the UID-GaN layer 502 is provided below the channel layer 416 and the gate electrode 410 extends into the n-type GaN layer 412*a* through the UID-GaN layer 502. Further, in the HEMT 800 as shown in FIG. 8, the gate oxide 426 is implanted with fluorine ions 702.

Figure 9:
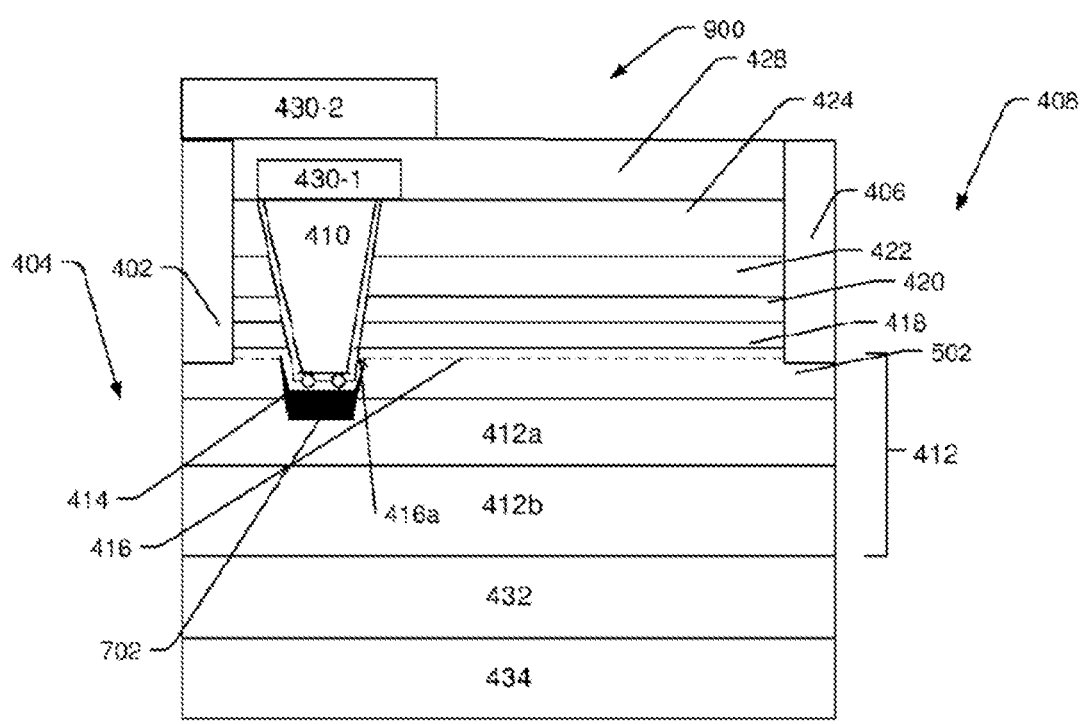
FIG. 9 illustrates yet another HEMT, in accordance with an implementation of the present subject matter.

FIG. 9 depicts yet another HEMT 900, in accordance with an implementation of the present subject matter. In the HEMT 900, the UID-GaN layer 502 is provided below the channel layer 410 and the gate electrode 410 extends from the passive dielectric layer 424 into the UID-GaN layer 502 without extending into the n-type GaN layer 412*a*. As shown in FIG. 8, the gate oxide 426 can be implanted with fluorine ions 702.

Figure 10:
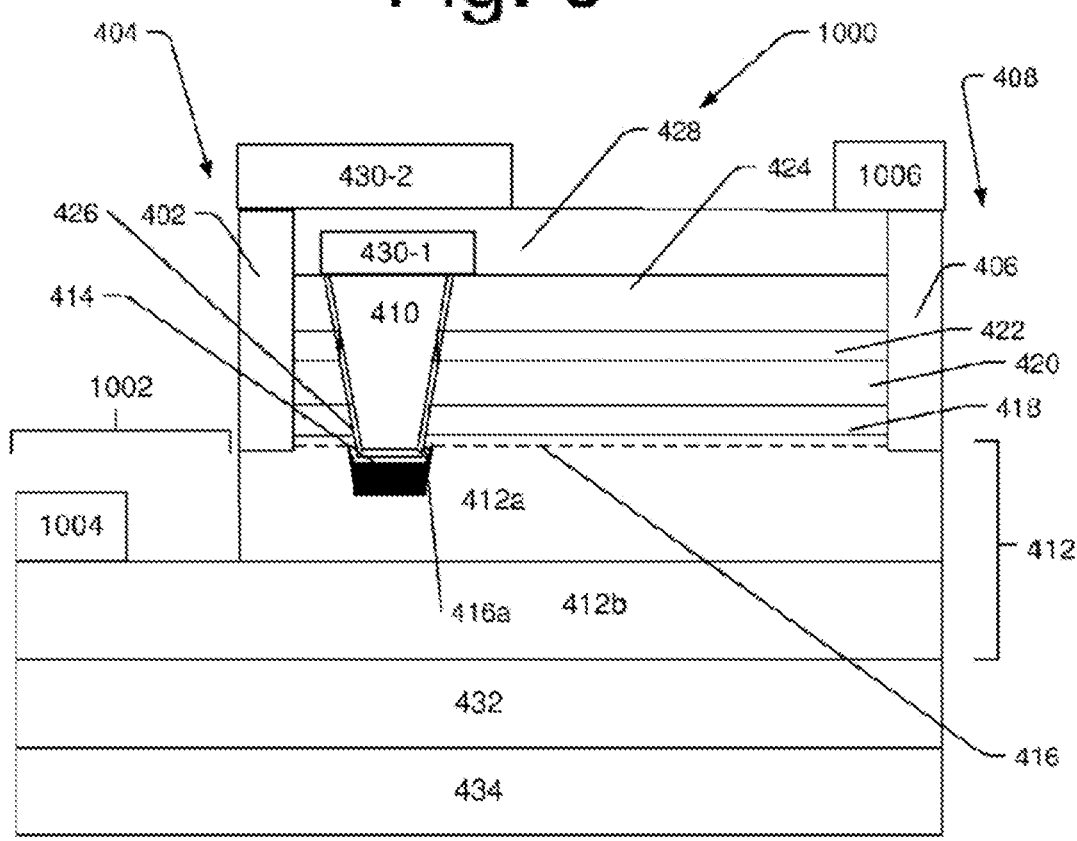
FIG. 10 illustrates yet another HEMT, in accordance with an implementation of the present subject matter.

FIG. 10 depicts yet another HEMT 1000, in accordance with an implementation of the present subject matter. In the HEMT 1000, the p-type GaN layer 412*b* can extends beyond the source electrode 402 into an extended portion 1002. A substrate contact 1004 may be provided on the p-type GaN layer 412*b* in the extended portion 1002. In an example, as shown in FIG. 10, the substrate contact 1004 does not contact the source electrode 402. However, the substrate contact may be in contact with the source electrode 402 as will be explained with reference to FIG. 11. In said HEMT 1000, a third FP 1006 may be provided over the drain electrode 406.

Figure 11:
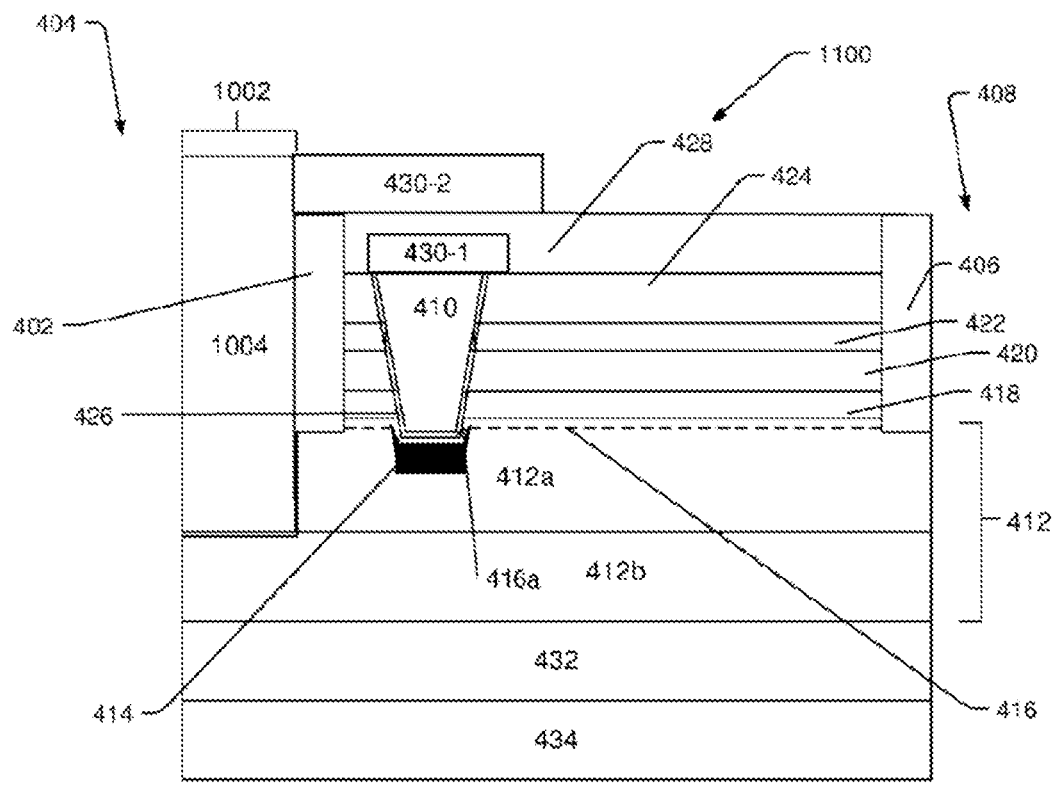
FIG. 11 illustrates yet another HEMT, in accordance with an implementation of the present subject matter.

FIG. 11 depicts yet another HEMT 1100, in accordance with an implementation of the present subject matter. In the HEMT 1100, the substrate contact 1002 is in contact with the source electrode 402. In an example, the substrate contact 1002 may be p-doped, the source electrode 402 may be n-doped, and the drain electrode 406 may be n-doped to form a p-n-p junction. As will be understood, other configurations of doping of the substrate contact 1002, source electrode 402, and the drain electrode 406 are possible as will be understood. In the example HEMT 1100, the second FP 430-2 extends partially over the ILD 428, the source electrode 402, and the substrate contact 1002.

Figure 12:
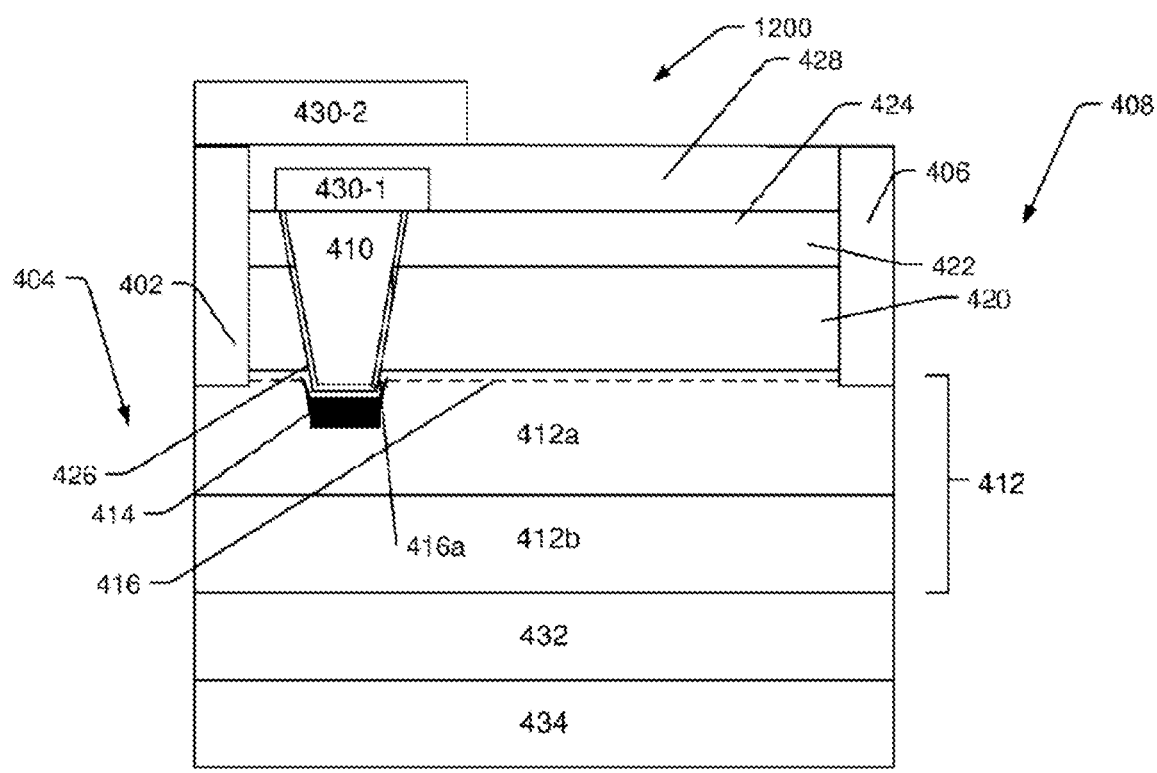
FIG. 12 illustrates yet another HEMT, in accordance with an implementation of the present subject matter.

FIG. 12 depicts yet another HEMT 1200, in accordance with an implementation of the present subject matter. In the HEMT 1100, the AlGaN layer 420 is provided directly over the n-type GaN layer 412*b* without the AlN layer provided therebetween. Therefore, in the example as shown in FIG. 12, the plurality of layers comprises the AlGaN layer 420, the passivation dielectric layer 422 provided on the AlGaN layer 420, and the ILD 424 provided on the passivation dielectric layer 422.

Figure 13:
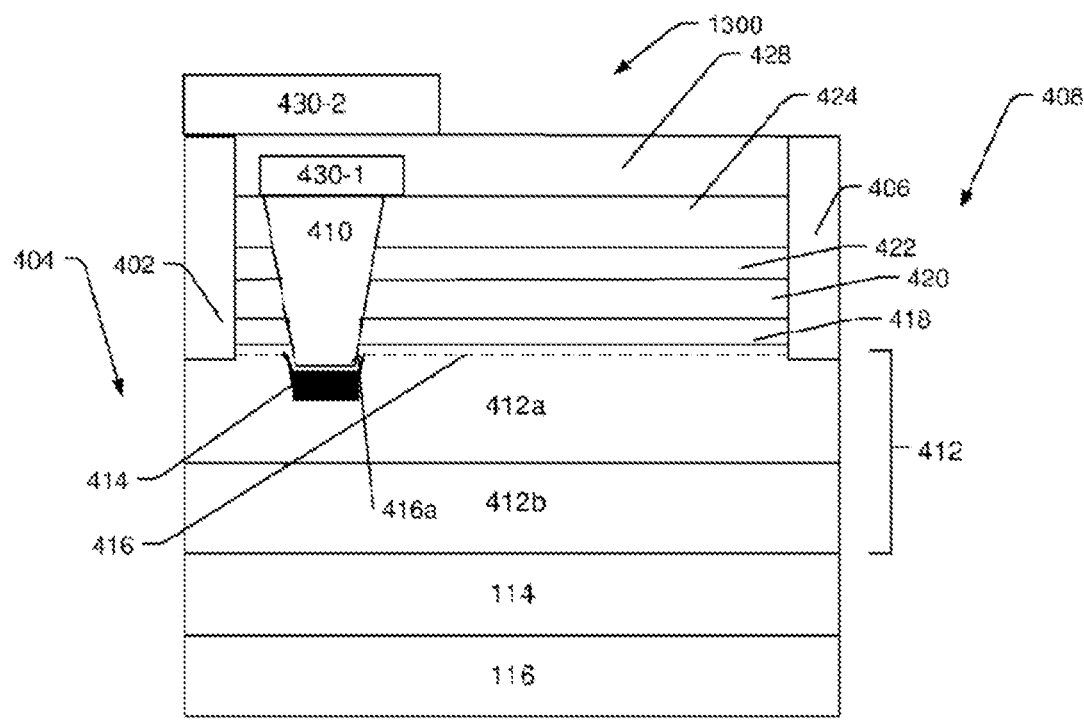
FIG. 13 illustrates yet another HEMT, in accordance with an implementation of the present subject matter.

FIG. 13 depicts yet another HEMT 1300, in accordance with an implementation of the present subject matter. In the HEMT 1300, the gate electrode 410 does not comprise the gate oxide coated thereon. The gate electrode 410 makes a Schottky contact with the plurality of layers and extends into the n-type GaN layer 412*b*.

Figure 14:
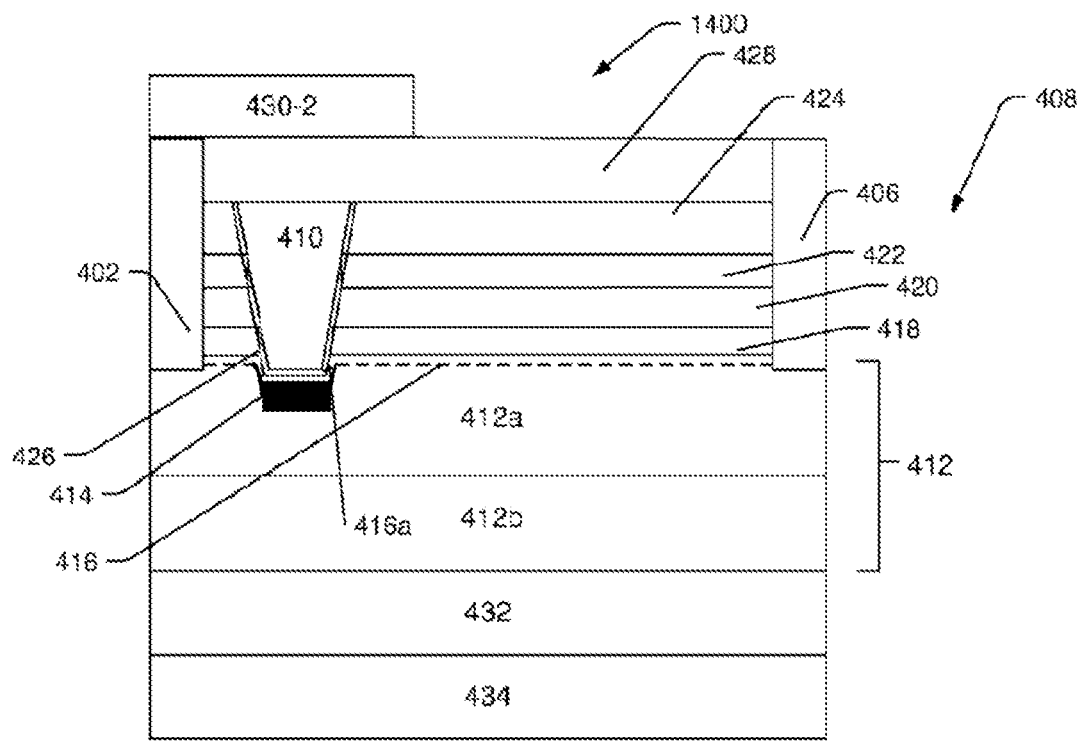
FIG. 14 illustrates yet another HEMT, in accordance with an implementation of the present subject matter.

FIG. 14 depicts yet another HEMT 1400, in accordance with an implementation of the present subject matter. In the HEMT 1400, the first FP is not provided over the gate electrode 410. In the HEMT 1400, impact ionization or avalanche breakdown can be centered near the drain electrode 406. As will be understood, on centering the impact ionization or the avalanche breakdown at the drain electrode 406, the first FP may not be required. This is because peak electric field at the gate electrode 410 is reduced with the RESURF junction 412 and the peak electric field can appear at the drain electrode 406 instead. Therefore, in the HEMT 1400, breakdown location can be shifted towards the drain electrode 406.

Figure 15:
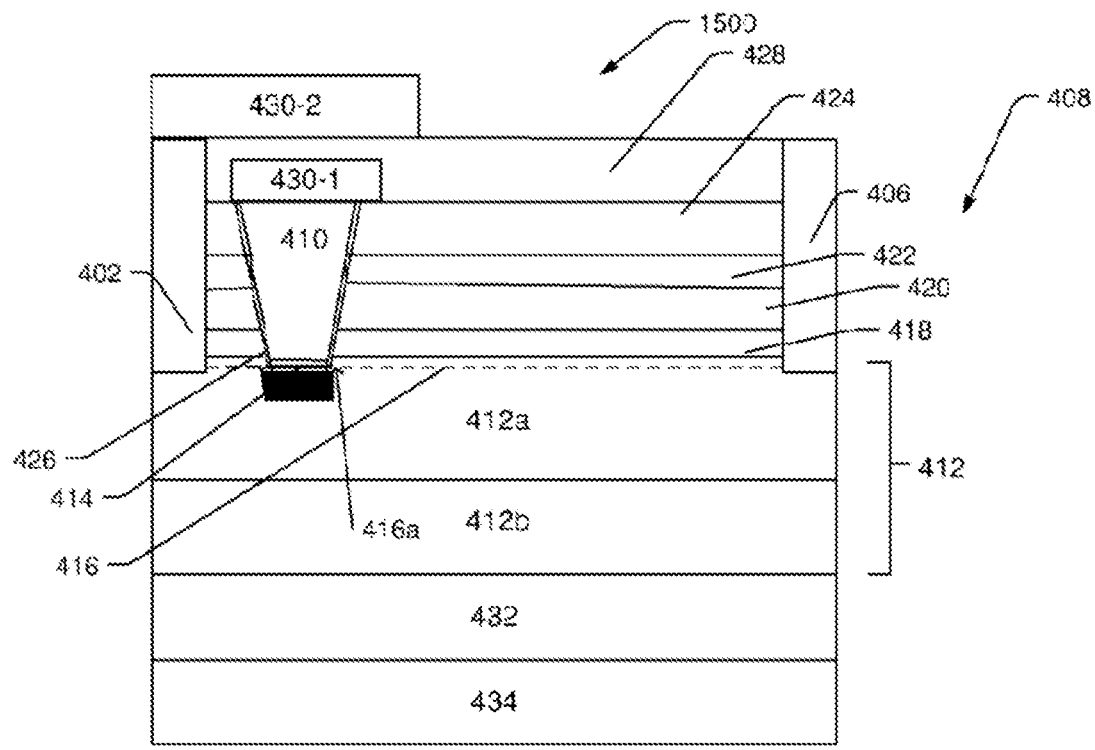
FIG. 15 illustrates yet another HEMT, in accordance with an implementation of the present subject matter.

FIG. 15 depicts yet another HEMT 1500, in accordance with an implementation of the present subject matter. In the HEMT 1500, the gate electrode 410 extends from the passivation dielectric layer 422 to the AlN layer 418 without extending into the n-type GaN layer 412a.

Figure 16:
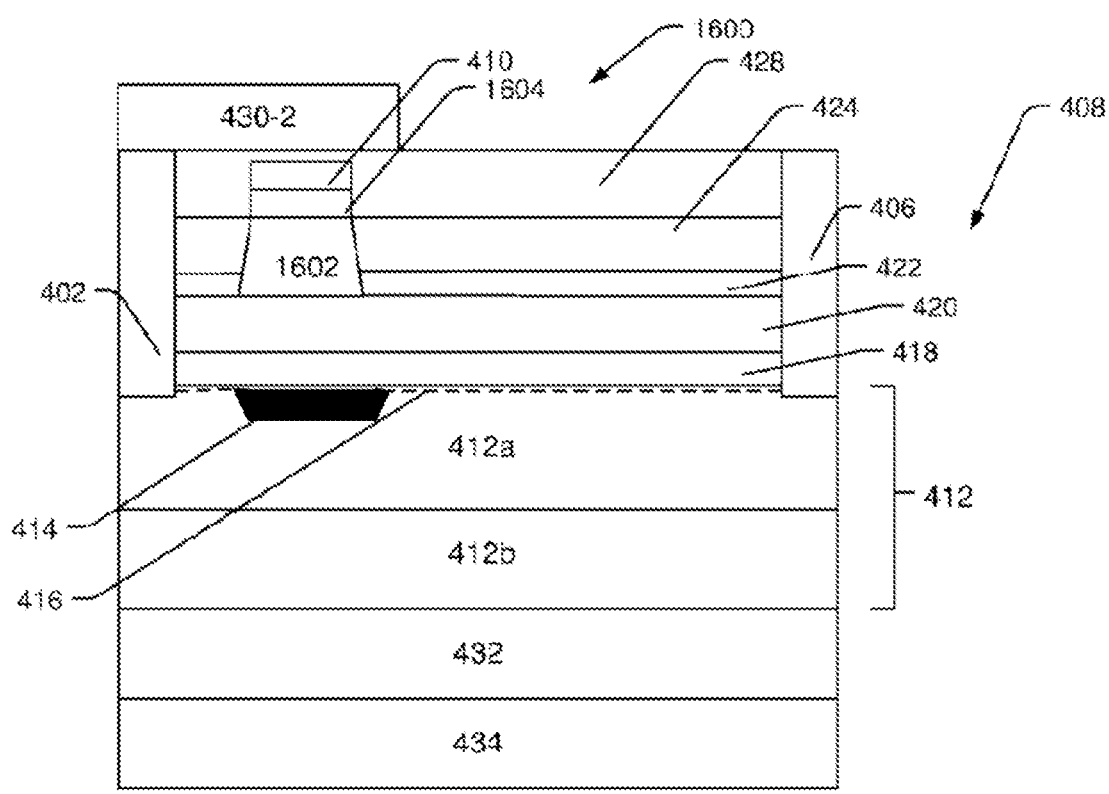
FIG. 16 illustrates yet another HEMT, in accordance with an implementation of the present subject matter.

FIG. 16 depicts yet another HEMT 1600, in accordance with an implementation of the present subject matter. In the HEMT 1600, the ILD 428 is provided on the passivation dielectric layer 424. A gate electrode structure extends from the ILD 428 to an interface of the GaN cap 422 with the AlGaN layer 420. The gate electrode structure comprises the gate electrode 410. The gate electrode 410 is provided on a gate dielectric 1604. The gate electrode 410 and the gate dielectric 1604 are provided in the ILD 428. The gate electrode structure can also comprise a p-GaN gate layer 1602. The gate dielectric 1604 can be provided on the p-GaN gate layer 1602. The p-GaN gate layer 1602 can extend from the passivation dielectric layer 424 to the GaN cap 422.

In the HEMT 1600, the p-GaN gate layer 1602 functions as an inverse polarization layer and can be used to deplete the channel layer 416. In an example, the UID-GaN layer may be provided over the n-type GaN layer 412b and below AlN layer 418. In another example, the AlN layer 418 may be absent and the UID-GaN layer may be provided below the AlGaN layer 420. In an example, gate dielectric 1604 may be implanted with fluorine ions.

In operation, the channel layer 416 is depleted of electrons due to present of the RESURF junction 412. With reference to FIGS. 4-15, when negative voltage or no voltage is applied at the gate electrode 410, due to etching below the gate electrode 410, no electrical contact is formed between the source electrode 402 and the drain electrode 406, i.e., the etched portion 416a below the gate electrode 410 remains depleted when negative voltage or no voltage is applied the gate electrode 410. Therefore, the HEMTs as shown in FIGS. 4-16 are normally OFF. In another example, as shown in FIG. 16, when negative voltage or no voltage is applied at the gate electrode 410, the channel layer 416 is depleted due to presence of p-GaN gate layer 1602 and no electrical contact is formed between the source electrode 402 and the drain electrode 406.

On application of a positive gate voltage beyond a threshold value, due to the presence of the RESURF junction 412, the 3-D buried channel of electrons 414 is formed substantially below the gate electrode 410. The 3-D buried channel of electrons 414 forms due to electrons provided by the RESURF junction 412. The 3-D buried channel of electrons 414 is formed in the n-type GaN layer 412a due to n-doping of the GaN layer which provides the electrons for formation of the 3-D buried channel of electrons 414. The 3-D buried channel of electrons 414 helps in electrically connecting the channel layer 416 formed between the source electrode 402 and drain electrode 406. Therefore, the 3-D buried channel of electrons 414 helps in electrically connecting the source electrode 402 to the drain electrode 406, thereby, switching the HEMTs ON. In an example, gate voltage varies in a range of 0-15 V and the drain voltage varies in a range of 0-1000 V.

The present subject matter will now be illustrated with working examples, which are intended to illustrate the working of disclosure and not intended to be taken restrictively to imply any limitations on the scope of the present disclosure. Unless defined otherwise, all technical and scientific terms used herein have the same meaning as commonly understood to one of ordinary skill in the art to which this disclosure belongs. It is to be understood that this disclosure is not limited to the particular methods and experimental conditions described, as such methods and conditions may vary depending on the process and inputs used as will be easily understood by a person skilled in the art.

EXAMPLES

Example-1: Fabrication of an Example HEMT

A buried channel normally-off device with a RESURF junction was fabricated with Mg as p-type dopant and Si as n-type dopant. The expected hole and electron concentration in the RESURF junction were $3\times10^{16}$ cm$^{-3}$ (600 nm thick) and $1\times10^{17}$ cm$^{-3}$ (100 nm thick), respectively. The fabricated HEMT had 100 μm width, 11 μm source-drain spacing, 3 μm gate length. A reference device was also fabricated to compare the performance. The reference device growth stack did not have any doping in the layer below the AlGaN layer, i.e., an intrinsic GaN layer was provided in the HEMT below the AlGaN layer. The thickness of the intrinsic GaN layer was kept same as the thickness of the RESURF junction.

Figure 17:
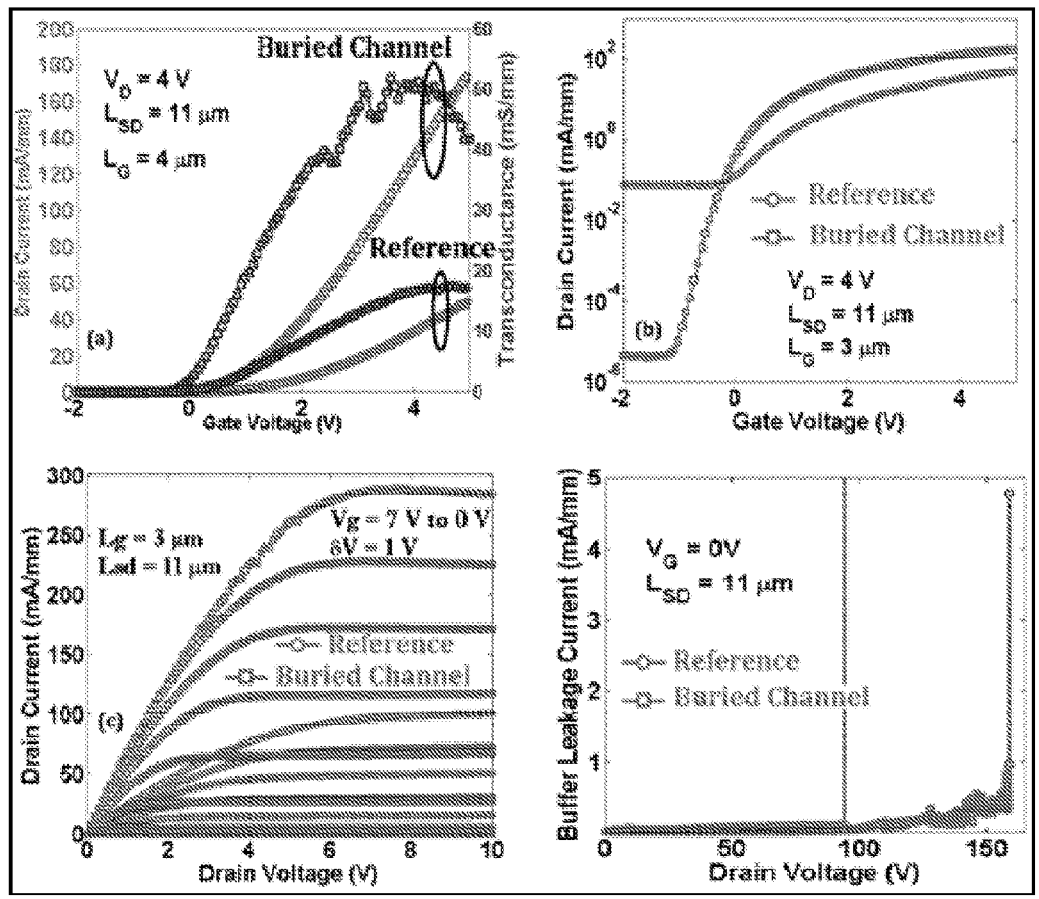
FIG. 17 illustrates the (a) transfer characteristics, (b) trans-conductance, (c) output characteristics and (d) breakdown characteristics of the HEMT of the present subject matter, in accordance with an implementation of the present subject matter.

FIG. 17(a)-(d) compares the ON-state and OFF-state characteristics of the HEMT having the RESURF junction of the present subject matter and the reference device. FIG. 17(a) compares the transfer characteristics of the buried channel device and the reference device. Both the device exhibited a normally off operation as shown in the figure. The maximum value of transconductance was found to be 17 mS/mm and 52 mS/mm for devices on reference stack and buried channel stack respectively. More than three times increase in the field effect mobility was ascribed to lesser interface scattering effect on electron transport in buried channel device. FIG. 17(b) provides comparison of drain current characteristics for the HEMT of the present subject matter and the reference device in logarithmic scale.

The off-state drain leakage current in devices on buried channel stack was found to be four orders of magnitude lower than that of devices on reference stack (4 nA/mm for buried channel device compared to 76 uA/mm for reference). The p-n junction in the RESURF junction of buried channel stack ensured that the RESURF junction is depleted and hence there was low leakage current. The buried channel devices exhibits an on/off current ratio of $7\times10^7$.

FIG. 17(c) compares the output characteristics of the reference device and the HEMT of the present subject matter. The maximum drain current was found to be 100 mA/mm and 287 mA/mm for the reference device and the HEMT of the present subject matter stack respectively at a gate voltage of 7 V. FIG. 17(d) illustrates comparison of output characteristics of the HEMT of the present subject matter and the reference device. FIG. 17(d) further provides three terminal breakdown characteristics of the HEMT of the present subject matter and the reference device. Both ON-state and OFF-state characteristics of the HEMT of the present subject matter were found to be better than the reference device.

Breakdown voltage can be further increased by adjusting the doping concentration and thickness of the p-type and n-type region in the RESURF junction at the expense of improved ON-state resistance with buried channel operation.

Example-2: Study of Field Spread

Simulations were performed to study the effect of the RESURF junction on the electric field. FIG. 18(a) and FIG.

18(*b*) captures the difference between the HEMT of the present subject matter and a reference device. In this example, the reference device included an n-doped GaN layer provided below the AlGaN layer without the presence of the p-type GaN layer. Therefore, while the HEMT of the present subject matter included the p-type GaN layer and the n-type GaN layer, the reference device included only the n-type GaN layer as part of the RESURF junction. However, the thickness for both the HEMT of the present subject matter and the reference device was kept same.

Figure 18:
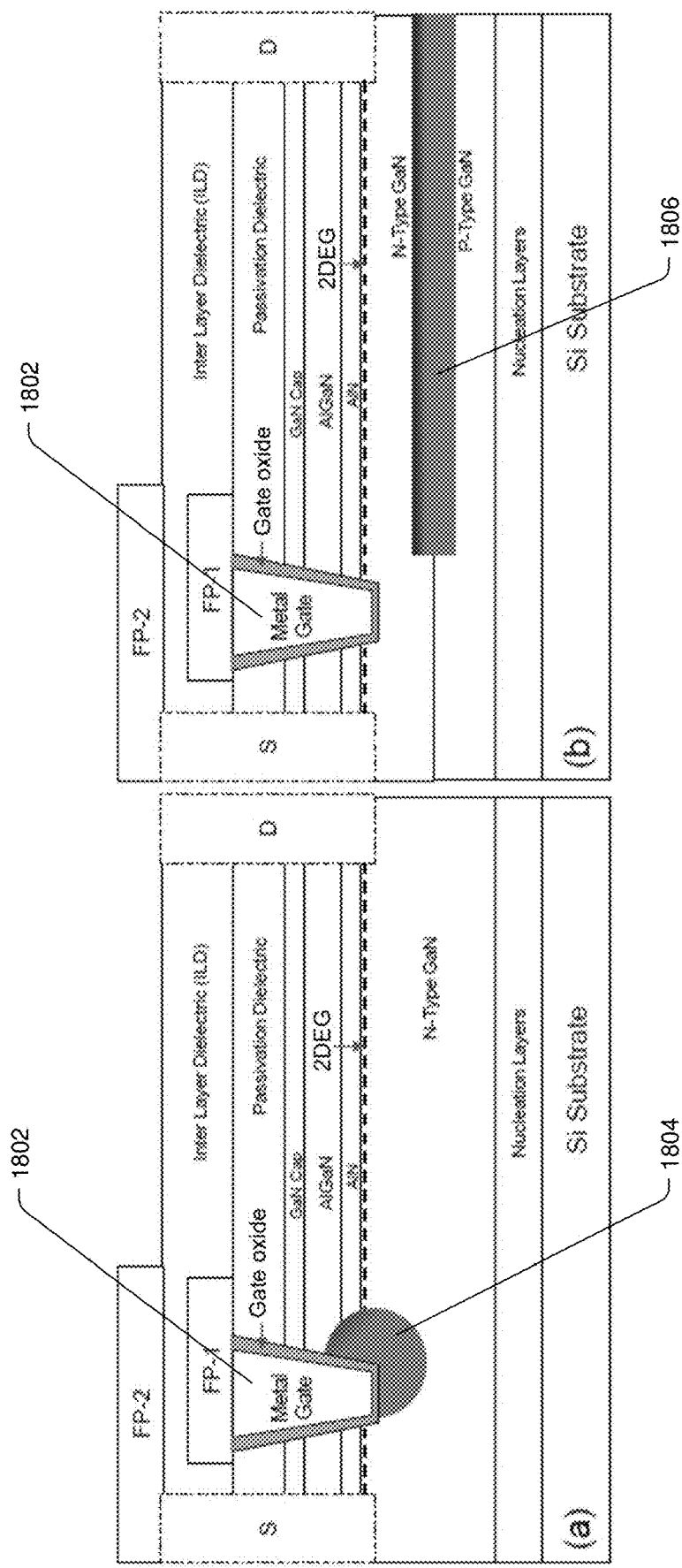
FIG. 18 illustrates simulation of electric field in (a) a reference device and (b) HEMT of the present subject matter, in accordance with an implementation of the present subject matter.

FIG. 18(*a*) illustrates the spread of electric field in the reference device and FIG. 18(*b*) illustrates the spread of electric field in the HEMT of the present subject matter. As was observed, the HEMT of the present subject matter provided a better spread of the electric field compared to the reference device. The reference device (FIG. 18(*a*)) showed a concentration of the electric field below the gate electrode 1802. The concentration of the electric field is as indicated for numeral 1804. The HEMT of the present subject matter (FIG. 18(*b*)) showed spread of electric field better than that of the reference device. The spread of electric field in the RESURF junction of the HEMT of the present subject matter is as indicated by numeral 1806. The spread of electric field can help in the lowering of peak electric field that allows further increase in drain voltage without avalanche breakdown and therefore improves junction breakdown voltage of the device.

Figure 19A:
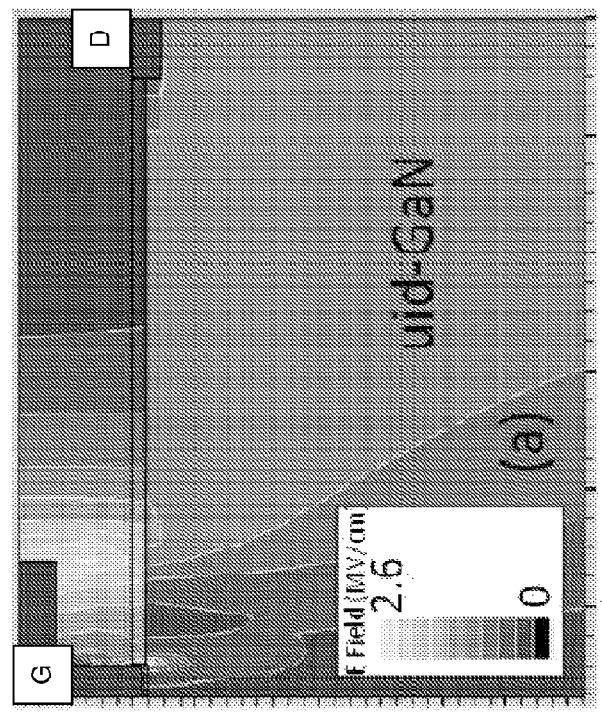
FIG. 19(a) and FIG. 19(b) show the simulation of the HEMT in an electric field visualization simulator, in accordance with an implementation of the present subject matter.
Figure 19B:
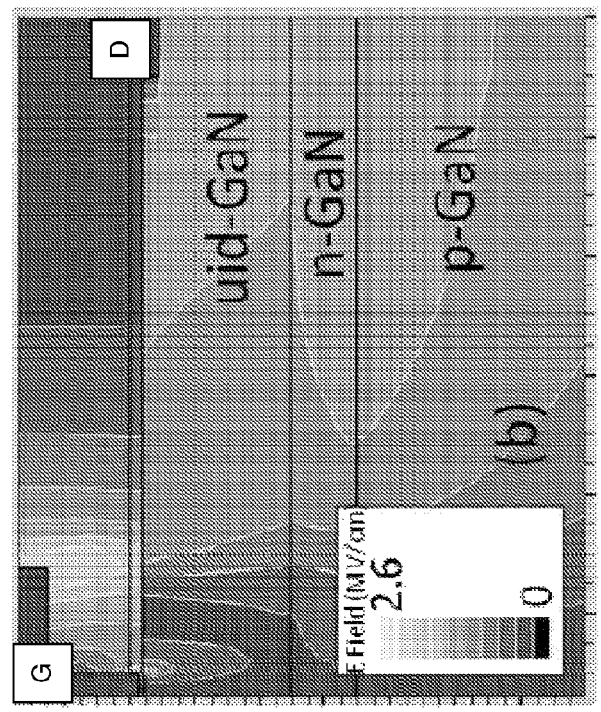

FIG. 19(*a*) and FIG. 19(*b*) show the simulation of the electric field in the reference device and the HEMT device of the present subject matter, respectively. FIG. 19(*a*) and FIG. 19(*b*) were obtained using a filed visualization simulator known in art. The inclusion of the RESURF junction in the HEMT of the present subject matter showed spread out of electric field between the gate electrode and the drain electrode. This directly improves the performance of the device under higher voltage stress and thus improves breakdown rating of the device.

Furthermore, shifting the hot spot away from gate edge, improves the hot carrier and gate oxide reliability. It is also worth highlighting that shifting the peak electric field away from gate edge minimizes the requirement of field plate and hence lowers the miller capacitance. This in-turn improves the switching performance as well as cut-off frequency of the device. This resulting improved performance is captured and illustrated in FIG. 20.

Figure 20:
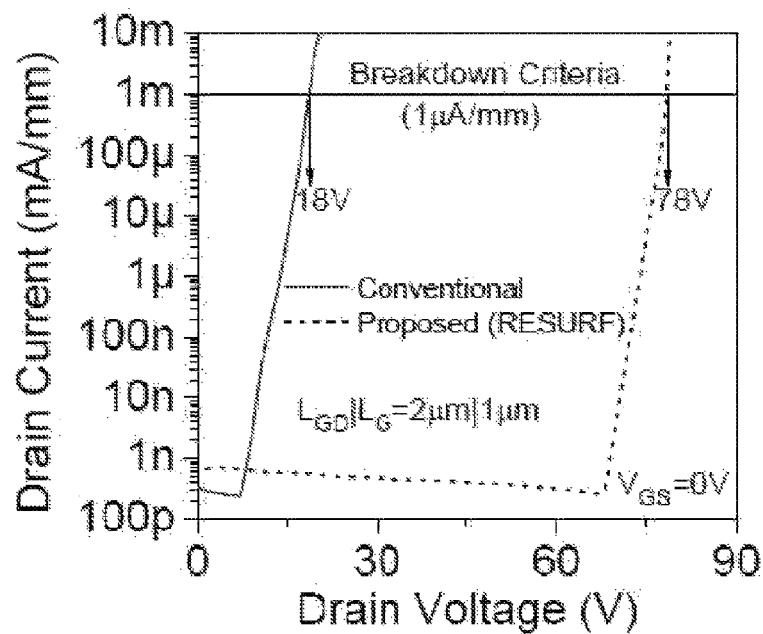
FIG. 20 illustrates the Simulated OFF state three terminal increased breakdown characteristics of conventional device and HEMT of the present subject matter, in accordance with an implementation of the present subject matter.

FIG. 20 illustrates the Simulated OFF state three terminal breakdown characteristics of conventional recess gate device and recess gate RESURF HEMT of the present subject matter. The device of this present subject matter offers ~4× higher breakdown voltage for given set of design parameters as shown as FIG. 20. A further advantage of the HEMT of the present subject matter is the improved (lowered) ON state resistance of the conducting channel under ON conditions.

Example-3: Simulation of Electron Transfer

Figures 21A, 21B:
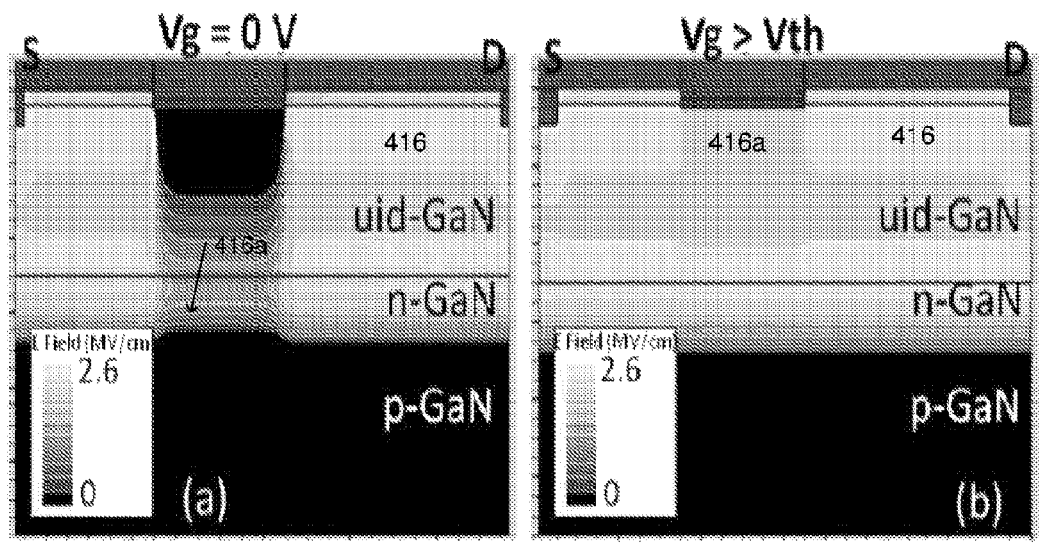
FIG. 21(a) and FIG. 21(b) show simulated electron concentration contour plot of the device stack with respect to gate control voltage, in accordance with an implementation of the present subject matter.

FIG. 21(*a*) shows simulated electron concentration contour plot of the device stack at OFF state showing fully depleted area within the etched portion 416*a* and FIG. 21(*b*) depicts the completed channel layer 416 at a gate voltage of 1.5 V. Therefore, the channel layer 416 is completed by the 3-D buried channel of electrons 414 which is formed at about 30 nm away from the gate oxide 426 (not shown).

The RESURF junction results in an improved ON-state performance by forming a buried channel away from the metal-insulator and semiconductor interface. In AlGaN/GaN HEMT structures the buried channel can be realized by merging of two depletion regions below gate electrode, one from the gate metal-insulator-semiconductor junction and other from a p-n junction (RESURF junction) grown in the buffer layer.

Barrier height of the gate contact and thicknesses and doping concentrations of p-type and n-type regions are the parameters to be optimized for the merging of the two depletion regions. This will ensure normally-off operation for the device. When a voltage above threshold voltage is applied on gate electrode, a channel is formed at the location where both the depletion regions intersect, leading to a bulk conduction against common surface conduction. The location of the channel can be controlled by controlling the width of the two depletion regions. Therefore, by using buried channel, the conduction channel is first formed in the bulk which helps to reduce the effect of interface defects on electron transport. With higher positive bias on the gate electrode surface channel also comes up in addition to the buried channel, leading to better ON resistance in the device of the present subject matter.

In the simulated illustration in FIG. 21(*a*), when the Gate to Source voltage $V_G$=0 the device is in OFF state. Therefore, the channel layer is not in conducting state. Under this condition with the PN RESURF junction of the present subject matter, the depletion regions of the Gate metal-Insulator-GaN junction and the PN junction merge as illustrated in FIG. 21(*a*). Thus, OFF resistance of the channel under blocked condition is increased. This further brings down the leakage current compared to a conventional device without the RESURF PN junction.

Under a positive gate bias, i.e. $V_G$>threshold, the channel conduction carrier density is improved by the additional carrier density that is now available in the n-type section of the RESURF PN junction under the influence of the recessed gate. Thus, the ON resistance goes lower than the conventional HEMT for the same device dimensions. This allows use of a smaller geometry device for the same conduction drain current when compared to the conventional HEMT.

Further, the electron concentration of buried channel is limited by the doping concentration of the n-type GaN layer, where the buried channel forms. Thus, the contribution of buried channel current towards the total ON state current can be increased by increasing the doping of n-type GaN layer. However, at high doping levels the mobility of the electrons in buried channel is limited by impurity ion scattering. The ON state current increases despite the scattering of surface channel electrons at the etch damages due to the additional buried channel current and the OFF-state breakdown increases due to the RESURF junction and its depletion effect in the buffer stack.

Figure 22:
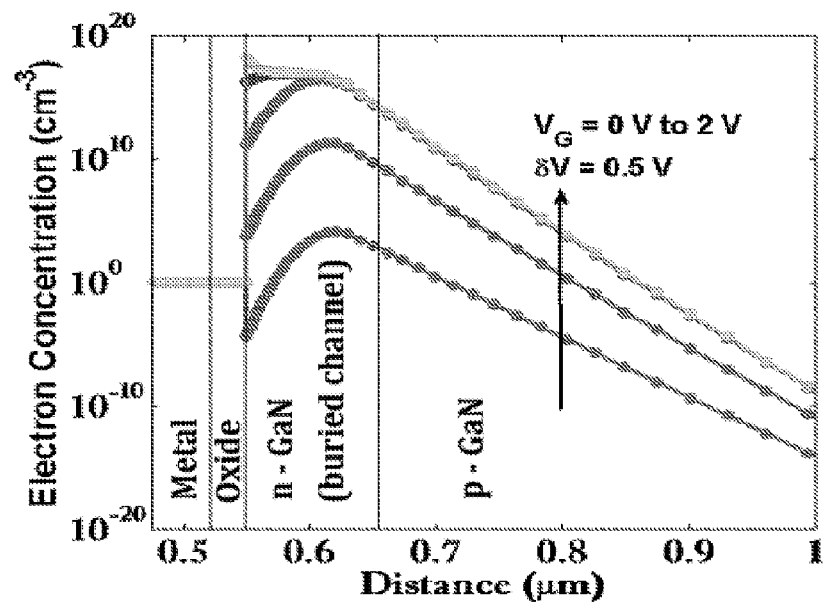
FIG. 22 illustrates the plot of the simulated electron concentration variation along a vertical cutline through gate electrode at different gate voltages from the recessed gate end through the RESURF junction, in accordance with an implementation of the present subject matter.

FIG. 22 illustrates the simulated electron concentration variation along a vertical cutline through gate electrode at different gate voltages. This confirms very low concentration of electrons at zero gate voltage, i.e. normally-off operation. This indicates better OFF characteristics, formation of buried channel at a gate voltage of 1.5V, and formation of channel inversion at a gate voltage above 1.5V. The contribution of the buried channel formed in the n-GaN improves the ON characteristics of the device over the conventional HEMT.

Figure 23:
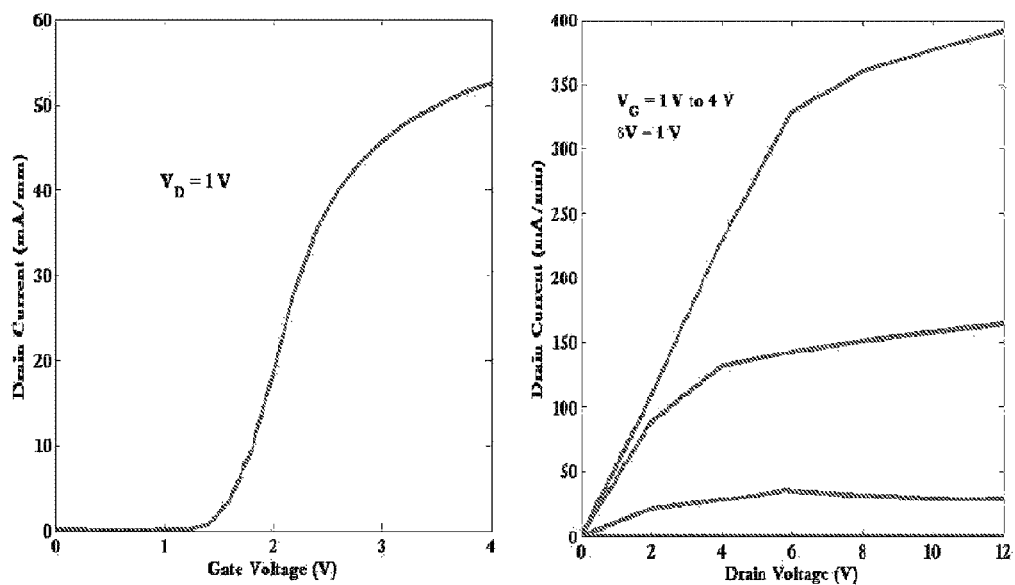
FIG. 23 shows the simulated gate transfer characteristics with respect to gate voltage and channel current of the HEMT device comprising buried RESURF channel of the present subject matter, in accordance with an implementation of the present subject matter.

FIG. 23 shows the simulated gate transfer characteristics and output characteristics of the device comprising buried RESURF channel HEMT of the present subject matter. The transfer characteristics shows that a device with positive threshold voltage (normally-off operation) can be fabricated with the proposed device architecture and the drain current of the device exhibited a good control with the gate voltage as shown in the output characteristics.

The HEMT of the present subject matter provides an improved ON-resistance, improved OFF-state leakage current and improved breakdown voltage. It further mitigates the short channel effects and, therefore, improves the gate control over the channel. It also increases switching speed for a given breakdown voltage and provides improved device reliability which is essential for power electronics application.

Although the subject matter has been described in considerable detail with reference to certain examples and implementations thereof, other implementations are possible. As such, the scope of the present subject matter should not be limited to the description of the preferred examples and implementations contained therein.

We claim:

1. A High Electron Mobility Transistor (HEMT) comprising:
    a source electrode at a first end;
    a drain electrode at a second end;
    a gate electrode provided between the source electrode and the drain electrode; and
    a reduced surface field (RESURF) junction, wherein the RESURF junction extends from the first end to the second end, wherein the gate electrode is provided above the RESURF junction, wherein a three-dimensional (3-D) buried channel of electrons is formed in the RESURF junction on application of a positive voltage at the gate electrode, the RESURF junction comprising:
        an n-type Gallium nitride (GaN) layer; and
        a p-type GaN layer, wherein the n-type GaN layer is provided between the p-type GaN layer and the gate electrode.

2. The HEMT as claimed in claim 1, wherein the RESURF junction comprises an unintentionally doped (UID)-GaN layer provided on the n-type GaN layer.

3. The HEMT as claimed in claim 2, wherein the UID-GaN layer is provided below the 3-D buried channel of electrons, wherein the HEMT comprises a plurality of layers provided on the 3-D buried channel of electrons, and wherein the plurality of layers comprises:
    an Aluminum nitride (AlN) layer provided on the 3-D buried channel of electrons;
    an Aluminium gallium nitride (AlGaN) layer provided on the AN layer;
    a GaN cap provided on the AlGaN layer; and
    a passivation dielectric layer provided on the GaN cap, wherein the gate electrode extends substantially from the passivation dielectric layer into the n-type GaN layer, wherein the gate electrode is coated with a gate oxide.

4. The HEMT as claimed in claim 2, wherein the UID-GaN layer is provided below the 3-D buried channel of electrons, wherein the HEMT comprises a plurality of layers provided on the 3-D buried channel of electrons, and wherein the plurality of layers comprises:
    an Aluminum nitride (AlN) layer provided on the 3-D buried channel of electrons;
    an Aluminium gallium nitride (AlGaN) layer provided on the AN layer;
    a GaN cap provided on the AlGaN layer;
    a passivation dielectric layer provided on the GaN cap, wherein the gate electrode extends substantially from the passivation dielectric layer into the UID-GaN layer, wherein the gate electrode is coated with a gate oxide.

5. The HEMT as claimed in claim 2, wherein the UID-GaN layer is provided below the 3-D buried channel of electrons, wherein the HEMT comprises a plurality of layers provided on the 3-D buried channel of electrons, and wherein the plurality of layers comprises:
    an Aluminum nitride (AlN) layer provided on the 3-D buried channel of electrons;
    an Aluminium gallium nitride (AlGaN) layer provided on the AlN layer;
    a GaN cap provided on the AlGaN layer; and
    a passivation dielectric layer provided on the GaN cap, wherein the gate electrode extends substantially from the passivation dielectric layer into the AlN layer.

6. The HEMT as claimed in claim 2, wherein the UID-GaN layer is provided below the 3-D buried channel of electrons, wherein the HEMT comprises a plurality of layers provided on the 3-D buried channel of electrons, and wherein the plurality of layers comprises:
    an Aluminum nitride (AlN) layer provided on the 3-D buried channel of electrons;
    an Aluminium gallium nitride (AlGaN) layer provided on the AlN layer;
    a GaN cap provided on the AlGaN layer;
    a passivation dielectric layer provided on the GaN cap; and
    an Inter-Layer Dielectric (ILD) is provided on the passivation dielectric layer, wherein the gate electrode extends from the ILD to the GaN cap, wherein the gate electrode comprises:
        a gate metal;
        a gate dielectric, wherein the gate metal is provided on the gate dielectric, wherein the gate metal and the gate dielectric are provided in the ILD; and
        a p-GaN gate layer, wherein the gate dielectric is provided on the p-GaN layer and wherein the p-GaN gate layer extends from the passivation dielectric layer to the GaN cap.

7. The HEMT as claimed in claim 1, wherein the 3-D buried channel of electrons is formed on the n-type GaN layer, wherein the 3-D buried channel of electrons comprises an etched portion substantially close to the source electrode, and wherein the gate electrode is provided substantially above the etched portion.

8. The HEMT as claimed in claim 7, wherein the HEMT comprises a plurality of layers provided on the 3-D buried channel of electrons.

9. The HEMT as claimed in claim 8, wherein the plurality of layers comprises:
    an Aluminum nitride (AlN) layer provided on the 3-D buried channel of electrons;
    an Aluminium gallium nitride (AlGaN) layer provided on the AN layer;
    a GaN cap provided on the AlGaN layer; and
    a passivation dielectric layer provided on the GaN cap, wherein the gate electrode extends substantially from the passivation dielectric layer into the n-type GaN layer, wherein the gate electrode is coated with a gate oxide.

10. The HEMT as claimed in claim 9, wherein
    an Inter-Layer Dielectric (ILD) is provided on the passivation dielectric layer;
    a first field plate (FP) is provided in the ILD above the gate electrode; and
    a second FP is provided on the ILD above the gate electrode, wherein the second FP extends over the source electrode at the first end.

11. The HEMT as claimed in claim 10, wherein the p-type GaN layer extends beyond the source electrode into an extended portion and wherein a substrate contact is provided on the p-type GaN layer in the extended portion.

12. The HEMT as claimed in claim 11, wherein a third FP is provided over the drain electrode at the second end.

13. The HEMT as claimed in claim 11, wherein the second FP extends over the substrate contact.

14. The HEMT as claimed in claim 9 wherein the gate oxide is implanted with fluorine ions.

15. The HEMT as claimed in claim 1, wherein the gate electrode is a Schottky gate.

* * * * *